US009123757B2

(12) United States Patent
Unno et al.

(10) Patent No.: US 9,123,757 B2
(45) Date of Patent: Sep. 1, 2015

(54) HEATING DEVICE AND SEMICONDUCTOR MANUFACTURING APPARATUS

(71) Applicant: NGK INSULATORS, LTD., Nagoya (JP)

(72) Inventors: Yutaka Unno, Handa (JP); Junya Waki, Handa (JP)

(73) Assignee: NGK Insulators, Ltd., Nagoya (JP)

( * ) Notice: Subject to any disclaimer, the term of this patent is extended or adjusted under 35 U.S.C. 154(b) by 353 days.

(21) Appl. No.: 13/795,552

(22) Filed: Mar. 12, 2013

(65) Prior Publication Data
US 2013/0248509 A1    Sep. 26, 2013

(30) Foreign Application Priority Data

Mar. 21, 2012   (JP) ................................. 2012-063054

(51) Int. Cl.
*H05B 3/68* (2006.01)
*C23C 16/00* (2006.01)
*H01L 21/67* (2006.01)
*H05B 3/28* (2006.01)
*H05B 1/02* (2006.01)
*H01L 21/687* (2006.01)

(52) U.S. Cl.
CPC .... *H01L 21/67103* (2013.01); *H01L 21/68792* (2013.01); *H05B 1/0233* (2013.01); *H05B 3/283* (2013.01)

(58) Field of Classification Search
CPC .................. H01L 21/67103; H01L 21/68792; H05B 1/0233; H05B 3/283
USPC ................................ 219/444.1; 118/724, 725
See application file for complete search history.

(56) References Cited

U.S. PATENT DOCUMENTS

| 6,423,949 | B1 * | 7/2002 | Chen et al. ................. 219/444.1 |
| 8,168,926 | B2 * | 5/2012 | Goto .......................... 219/461.1 |
| 8,294,069 | B2 * | 10/2012 | Goto et al. .................... 219/544 |
| 2003/0173349 | A1 | 9/2003 | Unno et al. |
| 2007/0215597 | A1 * | 9/2007 | Goto et al. ................. 219/443.1 |

FOREIGN PATENT DOCUMENTS

JP    2003-272805 A1    9/2003

* cited by examiner

*Primary Examiner* — Sang Y Paik
(74) *Attorney, Agent, or Firm* — Burr & Brown, PLLC

(57) ABSTRACT

A heating device 10 includes a ceramic base 20, a resistance heating element 22, and a hollow shaft 40. The ceramic base 20 includes a central portion 20a and a peripheral portion 20b. The resistance heating element 22 is designed in such a manner that the density of heating in the central portion 20a is 1.4 to 2.0 times that in the peripheral portion 20b. The hollow shaft 40 includes a first section 41 and a second section 42. The thickness tb1 of the first section 41 is 6 to 10 mm. The thickness tb2 of the second section 42 is 0.3 to 0.5 times the thickness tb1 of the first section 41. The length of the first section 41 is 0.4 to 0/8 times the overall length of the hollow shaft 40.

7 Claims, 5 Drawing Sheets

HEATING DEVICE AND SEMICONDUCTOR MANUFACTURING APPARATUS

BACKGROUND OF THE INVENTION

1. Field of the Invention

The present invention relates to a heating device and a semiconductor manufacturing apparatus, 2. Description of the Related Art To fabricate a semiconductor thin film using source gas, such as silane gas, by thermal CVD, plasma CVD, or the like, a semiconductor manufacturing apparatus employs a heating device for heating a wafer. A known type of heating device includes a disk-shaped ceramic base that has a wafer-receiving surface, a resistance heating element disposed inside or on the surface of the ceramic base, and a hollow shaft attached to the surface opposite to the wafer receiving surface of the ceramic base. Various methods for making the temperature of the wafer-receiving surface of the heating device uniform are known. For example, in the case where a coil-spring-shaped resistance heating element (winding element is buried in the ceramic base, the amount of heat generated per unit area of the wafer-receiving surface can be increased by increasing the number of turns of winding or the diameter of winding or by reducing the diameter of the wire. The amount of heat generated per unit area of the wafer-receiving surface (density of heating) can be reduced by reducing the number of turns of winding or the diameter of winding or by increasing the diameter of the wire.

CITATION LIST

Patent Literature

[PTL 1] Japanese Unexamined Patent Application Publication No. 2003-272805

SUMMARY OF THE INVENTION

When source gas is introduced immediately after starting a CVD process, the temperature of the central portion of a ceramic base may increase. Accordingly, a temperature distribution may be set in advance so that the temperature is lower in the central portion than in the peripheral portion of the ceramic base. Such a temperature distribution is referred to as a center-cool temperature distribution. For example, in the case where a coil -spring-shaped resistance heating element is used the center-cool temperature distribution can be easily realized by reducing the number of turns of winding in the central portion (i.e., reducing the density of heating in the central portion) relative to the number of turns of winding in the peripheral portion of the ceramic base. Generally, the temperature of the ceramic base is controlled by measuring the temperature of the ceramic base using a thermocouple and controlling power supplied to the resistance heating element so that the measured temperature reaches a predetermined target temperature. In case, the thermocouple is arranged to measure the temperature of the central portion of the base inside (i.e., inside the hollow shaft).

However, the temperature control property is degraded immediately after placing a wafer on a wafer-receiving surface or when heat input from the plasma to a wafer occurs during a CVD process, and it takes a long time until a stable temperature is obtained. This has posed a problem, such as the thickness of a film obtained by the CVD being uneven. The cause of the problem is as follows. As described above, the density of heating is lower in the central portion of the ceramic base than in the peripheral portion of the ceramic base in order to realize the center-cool temperature distribution. The thermocouple measures temperature in portion that has the low density of heating. Therefore, for example, in the case where the temperature measured by the thermocouple is below the target temperature and the power supplied to the resistance heating element is increased, the temperature increases more slowly in the central portion than In the peripheral portion due to the difference in density of heating. As a result, when the temperature measured by the thermocouple teaches the target temperature, that is, when the temperature of the central portion reaches the target temperature, the temperature of the peripheral portion may have already greatly exceeded the target temperature.

Such degradation of the temperature control property can be overcome by reducing the difference in density of heating between the central portion and peripheral portion of the ceramic base. However, in such a case, since the center-cool temperature distribution is reduced, the central portion may exhibit a higher temperature than the peripheral portion when source gas is introduced immediately after starting the CVD process. Meanwhile, the center-cool temperature distribution may be relatively increased by dissipating the heat of the ceramic base into the hollow shaft. However, when the temperature of the hollow shaft increases excessively, an O-ring, with which the lower end of the hollow shaft is sealed, may be deteriorated by heat and its sealing property may be degraded. Thus, it has been desired to achieve both the realization of the center-cool temperature distribution and the improvement of the temperature control, property and to prevent the temperature of the lower end of the hollow shaft from increasing excessively.

The present invention was made to address such a problem and a main object of the present inventions is, in a heating device for heating a wafer, to achieve both the realization of the center-cool temperature distribution and the improvement of the temperature control property and to prevent the temperature of the lower end of the hollow shaft from increasing excessively.

The inventors of the present invention originally thought that the density of heating must be smaller in the central portion than in the peripheral portion in order to realize the center-cool temperature distribution. However, with such a structure, in the case where power supplied to the resistance heating element was controlled so that the temperature of the central portion of the ceramic base reached the predetermined target temperature, the temperature control property was degraded. Then, the inventors have made a change in thinking and focused on realizing the center-cool temperature distribution by making the density of heating in the central portion to be larger than that in the peripheral portion. The inventors have also worked to change the shape of the hollow shaft in a variety of ways. As a result, the inventors have found that it is possible to achieve both the realization of the center-cool temperature distribution and the improvement of the temperature control property and to prevent the temperature of the lower end of the hollow shaft from increasing excessively. Thus, the present invention has been made.

A heating device according to the present invention includes: a disk-shaped ceramic base that has a wafer -receiving surface, a resistance heating element disposed inside the ceramic base or on a surface of the ceramic base, and a hollow shaft attached to a surface of the ceramic base opposite to the wafer-receiving surface of the ceramic base. The ceramic base includes a central portion and a peripheral portion. The peripheral portion is a ring-shaped region outside the central portion. The resistance heating element is set so that the density of heating is higher in the central portion than in the peripheral portion. The hollow shaft includes a first section that extends from the ceramic base to a predetermined intermediate position and a second section that extends from the intermediate position to a shaft end. The thickness of the first section is 2 to 3.3 times the thickness of the second section. The length of the first section is 0.4 to 0.8 times the overall length of the shaft.

The heating device according to the present invention can achieve both the realization of the center cool temperature distribution and the improvement of the temperature control property. In addition, the temperature of the lower end of the hollow shaft can be prevented from increasing excessively. Specifically, in this heating device, the density of heating is higher in the central portion than in the peripheral portion. Here, density of heating refers to the amount of heat generated per unit area of the wafer-receiving surface. During temperature control in which the power supplied to the resistance heating element is controlled so that he temperature of the central portion of the ceramic base reaches a predetermined target temperature, the temperature of the central portion, in which the temperature is measured and the density of heating is high, rapidly follows the increase in power supply and increases. Thus, the temperature control property of the ceramic base is improved. In the case where the densities of heating are set as above, the center-cool temperature distribution cannot usually be realized. However, a hollow shaft that has an innovative shape is attached to the central portion. Specifically, in the hollow shaft, the thickness of the first section is 2 to 3,3 times the thickness of the second section, and the length of the first section is 0.4 to 0.8 times the overall length of the shaft (the length of the second section is 0.2 to 0.6 times the overall length of the shaft). Because the first section is formed so as to be sufficiently thick, the heat of the central portion is likely to be discharged into the first section of the hollow shaft. As a result, the center-cool temperature distribution is realized. Furthermore, the amount of heat transferred from the first section to a cooling plate attached to the lower end of the hollow shaft is limited by the second section that has a small thickness. Therefore, the temperature of the lower end of the hollow shaft is prevented from increasing excessively and the sealing property of an O-ring interposed between the lower end and the poling plate is not impaired.

The heating device according to present invention may include a thermocouple that measures the temperature of the central portion of the ceramic base in order to control the temperature of the ceramic base. The present invention is particularly useful when applied to a heating device that includes such a the thermocouple, because the degradation of the temperature control property is an issue when the temperature of the ceramic base is controlled on the basis of the temperature measured with such a thermocouple.

In the heating device according to the present invention, preferably, the density of the resistance heating element is set so that the density of heating in the central portion is 1.4 to 2.5 times that in the peripheral portion. In this case, the temperature control property of the ceramic base is further improved.

In the heating device according to the present invention, the diameter of the first section is preferably larger than the diameter of the second section. In this case, a large amount of heat dissipated from the surface of the first section. The temperature of the hollow shaft is also prevented from increasing excessively.

In the heating device according to the present invention, the thickness of the first section may be 6 to 10 mm. In this case, the heat of the central portion is more likely to be discharged into the first section of the hollow shaft. As a result, the center-cool temperature distribution is realized with certainty.

A semiconductor manufacturing apparatus according to the present invention includes the heating device described above and a heat removal unit that removes heat from the hollow shaft at the intermediate position.

The semiconductor manufacturing apparatus according to the present invention can obtain an effect that can be obtained using the heating device described above. In addition, the temperature of the lower end of the hollow shaft can be relatively easily prevented from increasing excessively, because the heat can be removed from the hollow shaft at the intermediate position.

In the semiconductor manufacturing apparatus according to the present invention, the heat removal unit may be unit configured to suction a gas around the intermediate position or may be unit configured to inject a coolant gas toward the intermediate position. In this case, the structure of the apparatus is simplified because unit that is ordinarily provided in a semiconductor manufacturing apparatus is utilized as the heat removal unit. The heat removal unit is not limited to this and may be, for example, a heat sink attached to make contact with a region near the intermediate position of the hollow shaft.

DESCRIPTION OF THE PREFERRED EMBODIMENT

Figure 1:
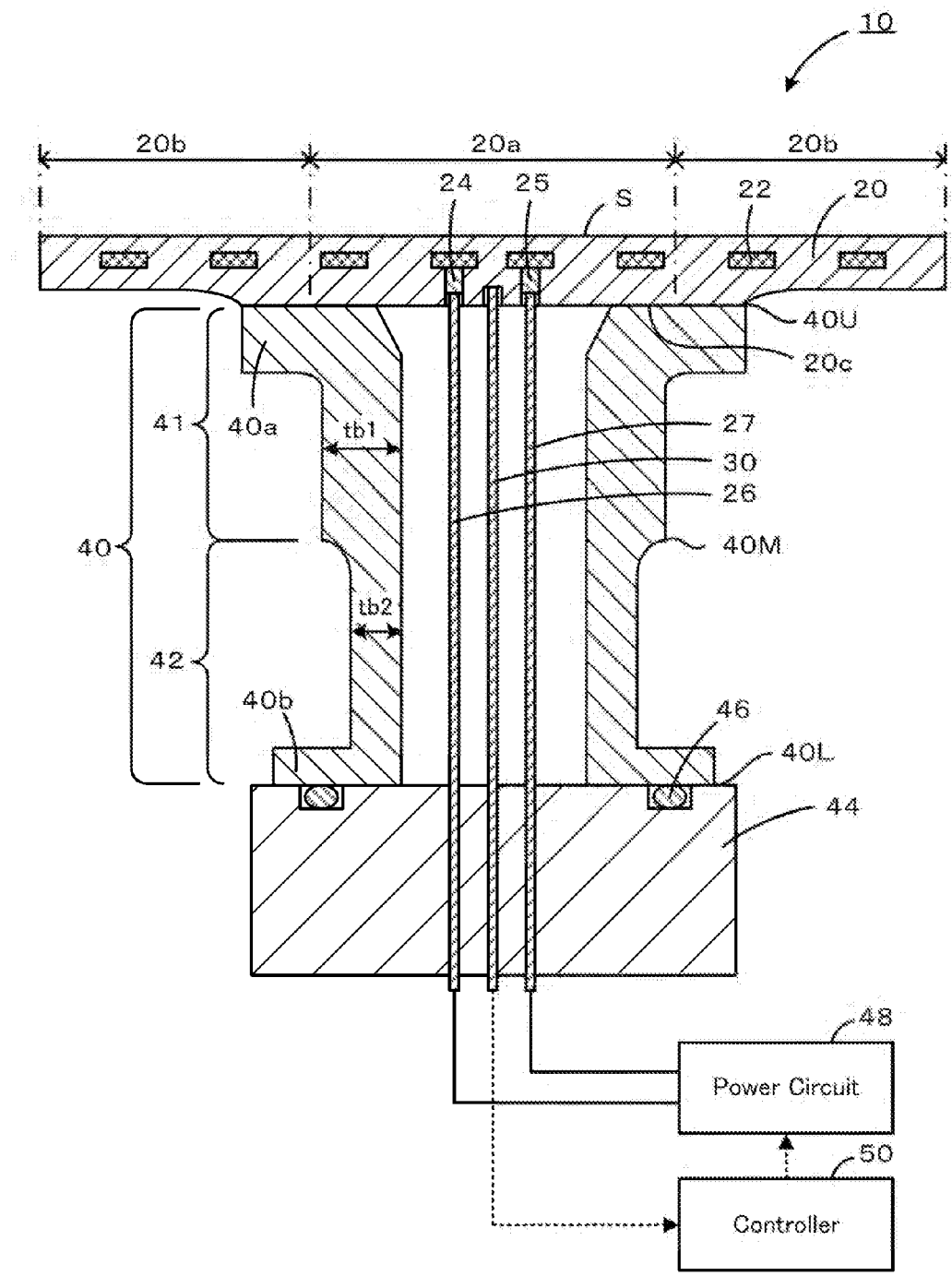
FIG. 1 is a longitudinal sectional view of a bearing device 10.
Figure 2:
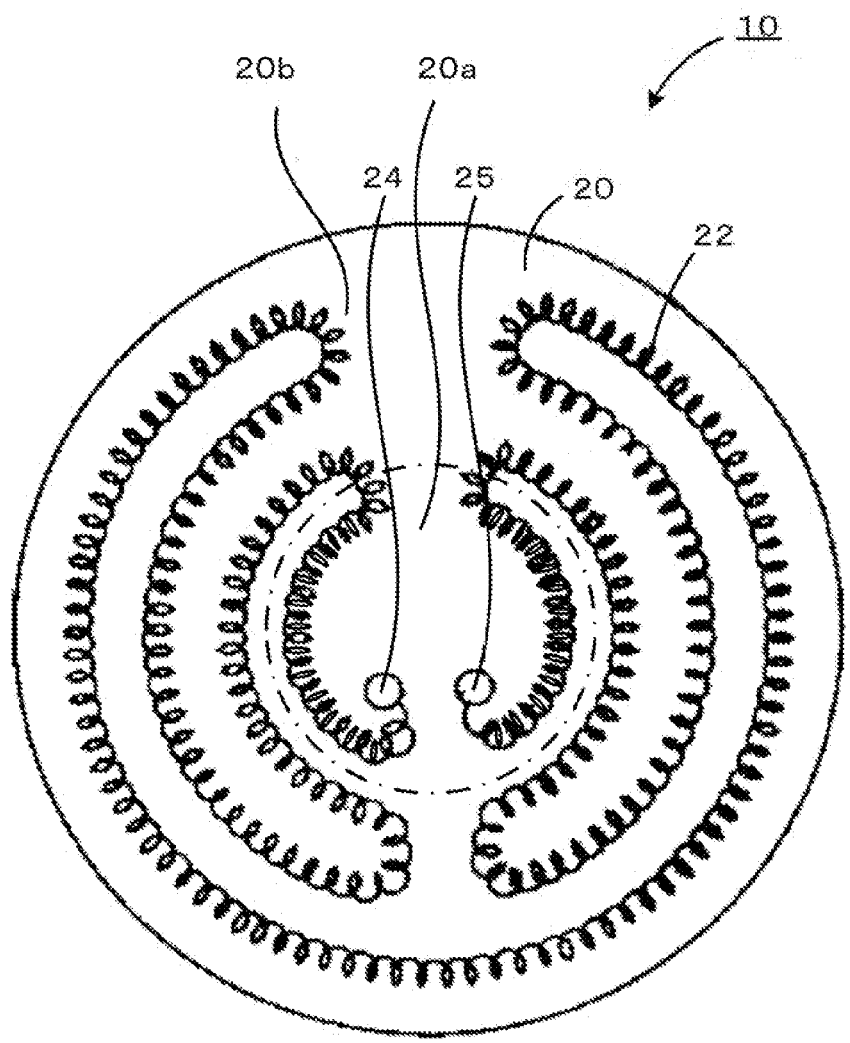
FIG. 2 is a plan view of a heating device 10 (note that a resistance heating element 22 and terminals 24 and 25 are shown in solid lines )

Hereinafter, the preferred embodiment of the present invention will be described with reference to the drawings. FIG. 1 is a longitudinal sectional view of a heating device 10. FIG. 2 is a plan view of the heating device 10 (note that a resistance heating element 22 and terminals 24 and 25 are shown in solid lines).

The heating device 10 is used as a table on which a semiconductor wafer is heated in a semiconductor fabricating process. The heating device 10 includes a disk-shaped ceramic base 20 that has a surface referred to as wafer-receiving surface S, a resistance heating element 22 buried in the ceramic base 20 a thermocouple 30 that measures the temperature of the ceramic base 20, and a hollow shaft 40 attached to the surface of the ceramic base 20 opposite to the wafer-receiving surface S.

The ceramic base 20 is a disk-shaped plate composed of a ceramic material such as aluminum nitride, silicon carbide, silicon nitride, or aluminum oxide. The thickness of the ceramic base 20 is, for example, 0.5 to 30 mm. A plurality of projections and depressions may be formed on the wafer-receiving surface S of the ceramic base 20 by embossing, or alternatively, a plurality of grooves may be formed. The ceramic base 20 includes a central portion 20a and a peripheral portion 20b. The central portion 20a is a circular region that is bounded by a circle concentric with the ceramic base 20 and has a diameter of about 40% of the diameter of the ceramic base 20. The peripheral portion 20b is a ring-shaped region outside the central portion 20a of the ceramic base 20. A thick portion 20c is formed near the center of the surface of the ceramic base 20 opposite to the wafer-receiving surface S. The thick portion 20c is formed so as to have a raised shape and serves as a circular table. The outer diameter of the thick portion 20c is substantially equal to the outer diameter of a first flange 40a of the hollow shaft 40. The thickness of the thick portion 20c is large than the thickness of other portions by about 10%.

As shown in FIG. 2, the resistance heating element 22 is formed in such a manner that the resistance heating element 22 starts at a positive terminal 24 disposed near the center of the ceramic base 20, is arranged over the entirety of the wafer-receiving surface S in the manner of a single continuous line, and reaches a negative terminal 25 disposed next to the positive terminal 24. The terminals 24 and 25 are connected to a power circuit 48 through feeding members 26 and 27, respectively. The power circuit 48 is controlled by a controller 50. The resistance heating element 22 has a coil-spring shape. In the ceramic base 20, the number of turns of winding per unit length is set so that the density (the amount of heat generated per unit area of the wafer-receiving surface) is higher in the central portion 20a, specifically, 1,4 to 2.0 times that in the peripheral portion 20b. Examples of the material of the resistance heating element 22 include molybdenum, tungsten, and molybdenum or tungsten compounds. The feeding members 26 and 27 are preferably composed of a metal and more preferably composed of Ni. Examples of the shape of the feeding members 26 and 27 include a rod shape and a wire shape. Examples of a method used to form connections between the terminal 24 and the feeding member 26 and between the terminal 25 and the feeding member 27 include screwing, caulking, fitting, brazing, welding, and eutectic soldering.

The thermocouple 30 measures the temperature of the central portion 20a of the ceramic base 20 and is inserted into a recess formed in the center of the surface of the ceramic base 20 opposite to the wafer-receiving surface S. The thermocouple 30 outputs the measured temperature as an electric signal to the controller 50. The controller 50 controls power supplied to the resistance heating element 22 by the power circuit 48 so that the difference between the temperature input from the thermocouple 30 and a predetermined target temperature is eliminated.

The hollow shaft 40 is a cylindrical body composed of the same ceramic material as he ceramic base 20, and is integrally joined to the thick portion 20c of the ceramic base 20. The feeding members 26 and 27, the thermocouple 30, and the like are disposed inside the hollow shaft 40. The first flange 40a is formed at the ceramic-base-20-side end the hollow shaft 40 and a second flange 40b is formed at the end opposite to the ceramic-base-20-side end. The first flange 40a is joined to the central portion 20a of the ceramic base 20. The second flange 40b is hermetically attached to a cooling plate 44 composed of metallic aluminum with an O-ring 46 interposed therebetween. The cooling plate 44 functions as a heat sink. A passage for allowing a coolant to circulate is formed inside the cooling plate 44. The hollow shaft 40 includes a first section 41 and a second section 42. The first section 41 is a section that extends from an upper end 40U to an intermediate position 40M. The thickness tb1 of the first section 41 is 6 to 10 mm. The length L1 of the first section 41 is 0.4 to 0.8 times the overall length L of the hollow shaft 40. The second section 42 is a section that extends from the intermediate, position 40M to a lower end 40L (shaft end). The thickness tb2 of the second section 42 is 0.3 to 05 times the thickness tb1 of the first section 41. In other words, the thickness tb1 of the first section 41 is 2 to 3.3 times the thickness of the second section 42. The hollow shaft 40 is disposed so as to be, except for the first and second flanges 40a and 40b, within the central portion 20a of the ceramic base 20 when viewed in plan.

Next, a production example of the heating device 10 will be described. Ceramic raw material powder used as a raw material of the ceramic base 20 is prepared. The resistance heating element 22 and terminals 24 and 25 are buried in the ceramic raw material powder. The resulting ceramic raw material powder is pressed to form a ceramic molded body. The ceramic molded body is subjected to hot-press firing to form the ceramic base 20. The diameter of the ceramic base 20 is the same as that of the ceramic molded body, but the thickness of the ceramic base 20 is reduced to about half the thickness of the ceramic molded body. Holes are then formed in the backside of the ceramic base 20 toward the terminals 24 and 25 so that the terminals 24 and 25 are exposed in the holes. A recess into which the thermocouple 30 is to be inserted is formed at the center of the backside of the ceramic base 20.

The hollow shaft 40 is prepared separately from the ceramic base 20. AlN raw material powder similar to the raw material of the ceramic base is placed in a mold and molded by cold isostatic pressing (CIP) to form a thick-walled cylindrical molded body the cylindrical molded body is fired to form a cylindrical fired body. The cylindrical fired body is ground to form the hollow shaft 40.

Subsequently, the ceramic base 20 and the hollow shaft 40 are joined with each other while being arranged to be coaxial with each other and the backside of the ceramic base 20 and the first flange 40a of the hollow shaft 40 are brought into contact with each other. The joining may he conducted by brazing, solid phase bonding, or solid-liquid phase bonding. Then, in the hollow shaft 40, the feeding members 26 and 27 are connected to the terminals 24 and 25, respectively, and a temperature-sensing part of the thermocouple 30 is inserted into the recess of the ceramic base 20. Finally, the lower end of the hollow shaft 40 is attached to the cooling plate 44 with the O-ring 46 interposed therebetween. The feeding members 26 and 27 and the thermocouple 30 are installed to vertically penetrate through the cooling plate 44 so as to keep the hermetically sealed state.

Figure 3:
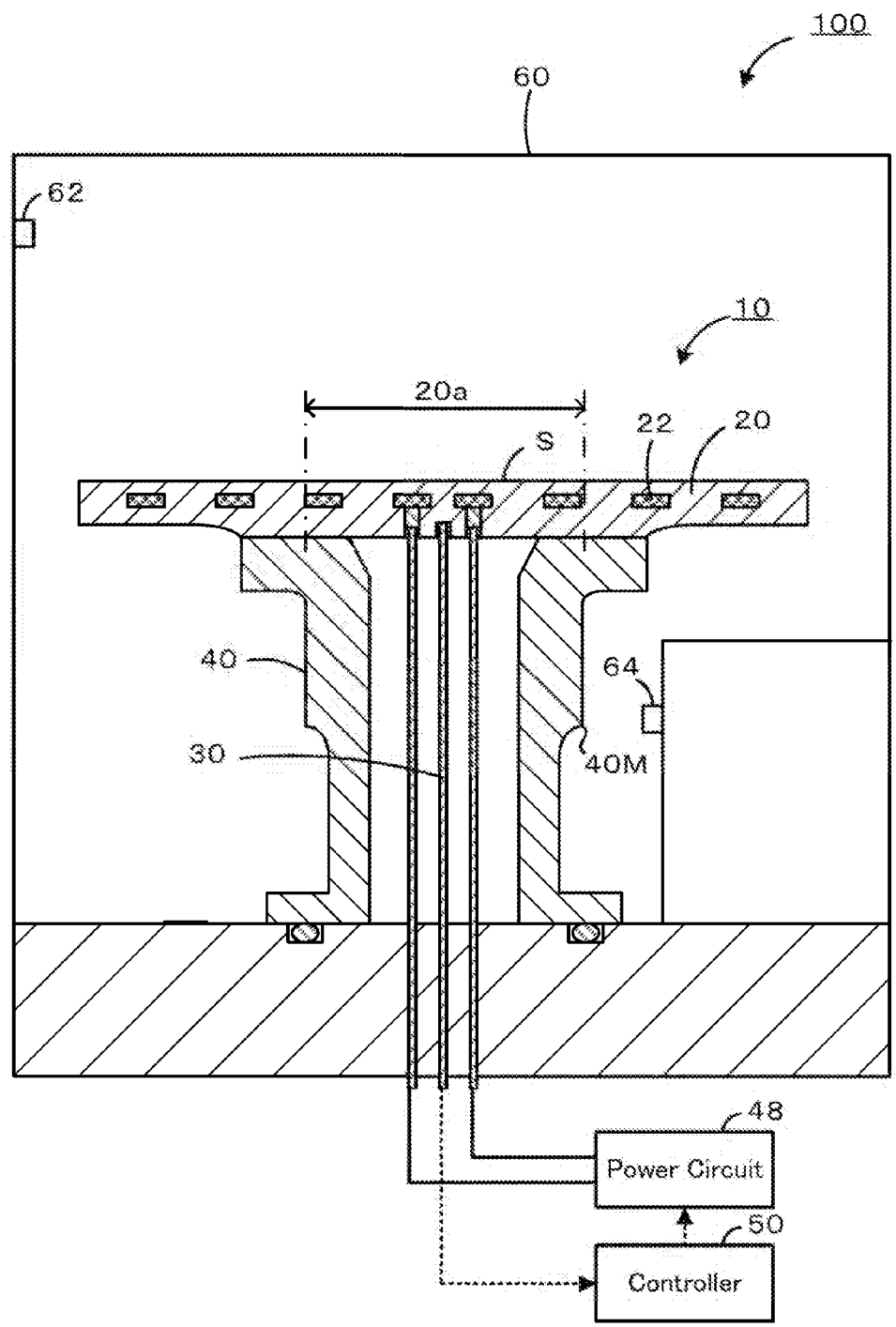
FIG. 3 is a schematic diagram of a semiconductor manufacturing apparatus 100.

An example of use of the heating device 10 will now be described. Here, a process for forming a semiconductor thin film on a wafer by plasma CVD using the heating device 10 is described. The heating device 10 is used as a component of a semiconductor manufacturing apparatus 100 shown in FIG. 3. The semiconductor manufacturing apparatus 100 includes the heating device 10 disposed inside a sealed chamber 60. The chamber 60 is equipped with a supply port 62 through which source gas, such as sparse gas, is supplied and a vacuum port 64 through which gas inside the chamber 60 is evacuated. The vacuum port 64 is disposed in the vicinity of the intermediate position 40M of the hollow shaft 40 and connected to a vacuum pump (not shown in the drawing).

In plasma CVD, the target temperature is set to 350° C. and temperature of the ceramic base 20 is controlled by the controller 50. The controller 50 controls the temperature of the ceramic base 20 by receiving the temperature of the central portion 20a of the ceramic base 20 from the thermocouple 30 and controlling power supplied to the resistance heating element 22 through the power circuit 48 so that the temperature of the central portion 20a reaches the target temperature. The source gas is supplied through the supply port 62 and gas inside the chamber 60 is evacuated through the vacuum port 64. After the temperature input from the thermocouple 30 substantially reaches the target temperature, a wafer is placed on the wafer-receiving surface S of the ceramic base 20 while continuing the temperature control of the ceramic base 20. Although the measured temperature decreases a few degrees because the temperature of the wafer itself is lower than the target temperature immediately after placing the wafer, the measured temperature increases again to the target temperature due to the temperature control performed by the controller 50. In this state, plasma is generated and the semiconductor thin film is formed on the wafer from the source gas.

In the heating device 10, the density of heating in the central portion 20a is 1.4 to 2.0 times that in the peripheral portion 20b. In the temperature control of the ceramic base 20, the temperature of the central portion 20a of the ceramic base 20 is measured and the power supplied to the resistance heating element 22 is controlled so that the measured temperature reaches the target temperature. When the power supply is increased, the temperature of the central portion 20a rapidly follows the increase in power supply and increases, because the density of the heating element is high in the central portion 20a in which the temperature is measured. Thus, the ceramic base 20 has a good temperature control property. Meanwhile, the center-cool temperature distribution cannot usually be realized when the resistance heating element 22 is constructed as described above. However, the hollow shaft 40 that has an innovative shape is attached to the central portion 20a. Specifically, the thickness tb1 of the first section 41 of the hollow shaft 40 is set to 6 to 10 mm (standard shaft thickness is about 3 mm). Since the first section 41 is formed so as to be sufficiently thick as described above the heat of the central portion 20a is likely to be discharged into the first section 41 of the hollow shaft 40. As a result, the center-cool temperature distribution is realized. When the source gas is supplied into the chamber 60 at the start of the plasma CVD, the center-cool temperature distribution changes to a substantially flat temperature distribution and all parts of the wafer have substantially the same temperature.

The thickness tb2 of the second section 42 is 0.3 to 0.5 times the thickness tb1. The length L1 of the first section 41 is 0.4 to 0.8 times the overall length L of the hollow shaft 40 (the length of the second section 42 is 0.2 to 0.6 times the overall length L). Thus, the amount of heat transferred from the first section 41 to the cooling plate 44 is limited by the second section 42 that has a small thickness. Therefore, the temperature of the lower end of the hollow shaft 40 is prevented from increasing excessively and the sealing property of the O-ring 46 is not impaired. The vacuum port 64 suctions gas around the intermediate position 40M of the flow shaft 40 and the heat of the hollow shaft 40 at the intermediate position 40M is thereby removed. The temperature of the lower end of the hollow shaft 40 also is prevented from increasing excessively. Furthermore, since the diameter of the first section 41 is larger than that of the second section 42, the surface area of the first section 41 is larger than of that of the second section 42. Thus, a large amount of heat is dissipated from the surface of the first section 41. The temperature of the lower end of hollow shaft 40 also is prevented from increasing excessively.

If the density of heating in the central port ion 20a is less than 1.4 times that the peripheral portion 20b, temperature control property is disadvantageously degraded. If the density of heating in the central portion 20a is more than 2.0 times that in the peripheral portion 20b, the temperature of the central portion 20a disadvantageously becomes excessively higher than that of the peripheral portion 20b. If the thickness tb1 of the first section 41 is less than 6 mm, the center-cool temperature distribution disadvantageously cannot be realized. If the thickness tb1 of the first section 41 is more than 10 mm, the temperature of the central portion 20a disadvantageously becomes excessively lower than that of the peripheral portion 20b. If the thickness tb2 of the second section 42 is less than 0.3 times the thickness tb1 of the first section 41, the center-cool temperature distribution disadvantageously cannot be realized. If the thickness tb2 of the second section 42 is more than 0.5 times the thickness tb1 of the first section 41, the temperature of the O-ring 46 disadvantageously increases excessively. If the length L1 of the first section 41 is less than 0.4 times the overall length L of the hollow shaft 40, the center-cool temperature distribution and the temperature control property become insufficient. If the length L1 of the first section 41 is more than 0.8 times the overall length L of the hollow shaft 40, the temperature of the lower end of the hollow shaft 40 increase excessively and the sealing property of the O-ring 46 may be disadvantageously impaired.

The heating device 10 according to the above-described embodiment can achieve both the realization of the center-cool temperature distribution and the improvement of the temperature control property. In addition, the temperature of the lower end of the hollow shaft 40 can be prevented from increasing excessively.

The present invention is not limited by the above-described embodiment and may naturally be implemented in a variety of forms within the technical scope of the present invention.

For example, in the above-described embodiment, the vacuum port 64 is disposed in the vicinity of the intermediate position 40M of the hollow shaft 40. However, an injection port through which coolant gas is injected toward the intermediate position 40M may be provided if the vacuum port 64 is to be disposed in another place. In this case, the heat is removed at the intermediate position 40M by the coolant gas injected through the injection port, and thereby the temperature of the lower end of the hollow shaft 40 is prevented from increasing excessively. Alternatively, a heat sink may be fixed to a region near the intermediate position 40M of the hollow shaft 40. In this case, the heat is removed at the intermediate position 40M through the heat sink, and thereby the temperature of the lower end of the hollow shaft 40 is prevented from increasing excessively.

In order to set the density of heating of the ceramic base 20 in the central portion 20a to be higher than that in the peripheral portion 2ob, in the above-described embodiment, the number of turns of winding per unit length of the coil-spring-shaped resistance heating element 22 is changed. Alternatively, the diameter of winding or the spacing (gaps between adjacent turns of coil spring) may be changed.

In the above-described embodiment, the resistance heating element 22 is formed over the entirety of the wafer-receiving surface S in the manner of a single continuous line. Alternatively, the wafer-receiving surface S may be divided into a plurality of regions and the resistance heating element 22 may be formed in each of the divided regions in the manner of a single continuous line. The wafer-receiving surface S may be divided into a plurality of regions by forming border with one or more circles concentric with the ceramic base 20. Yet alternatively, the disk-shaped ceramic base 20 may be divided by forming border lines with two or more radii. In this case, the disk-shaped ceramic base 20 may be divided into wedge-shaped regions that have a central angle of 360°/n (n is at integer of 2 or more).

In the above-described embodiment, the resistance heating element 22 has a coil-spring shape. However, the shape of the resistance heating element 22 is not limited to this and may be, for example, a net shape (mesh shape) or a film shape (sheet shape). In the case where the net-shaped heating element is used, the density of heating may be changed, for example, by changing the size of the mesh, the diameter of the wire, or the area of the heating element. In the case where the film-shaped heating element is used, the density of the film-shaped heating element may be changed, for example, by changing the area of the heating element.

In the above-described embodiment, the thick portion 20c is formed on the surface of the ceramic base 20 opposite to the wafer-receiving surface S. However, the thick portion 20c may be omitted and the thickness of the ceramic base 20 may be uniform.

In the above-described embodiment, the resistance heating element 22 is buried in the ceramic base 20. In addition, electrostatic electrodes for electrostatic chucking or high-frequency electrodes for generating plasma may be buried. The resistance heating element 22 is not necessarily hurried in the ceramic base 20 and may alternatively be disposed on the surface of the ceramic base 20.

In the above-described embodiment, the ceramic base 20 and the hollow shaft 40 are composed of the same ceramic material as each other. However, the ceramic base 20 and the hollow shaft 40 may be composed of different ceramic materials.

EXAMPLES

Experimental Examples 1 to 11

Figure 4:
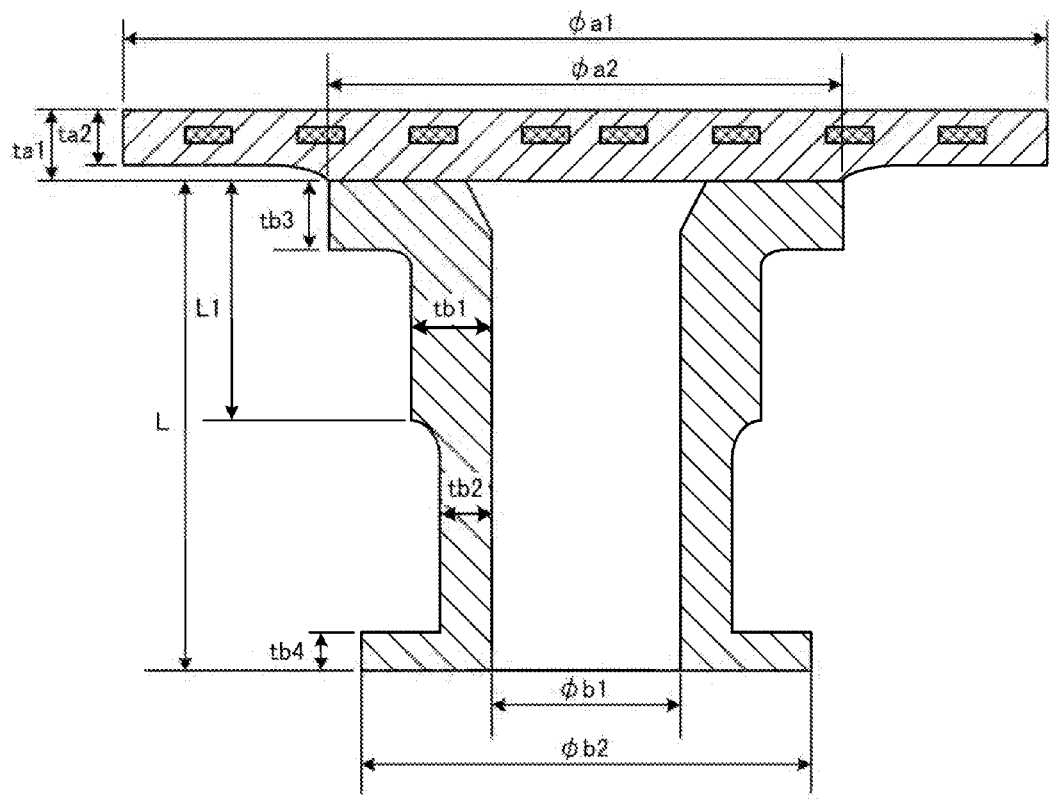
FIG. 4 is a diagram showing the dimensions of a heating device 10.

The heating device 10 shown in FIG. 1 was prepared for each of Experimental examples. FIG. 4 and Table 1 show the dimensions of the heating device 10 of each of Experimental examples. A specific preparation procedure is described below.

First, an AlN molded body was prepared. The AlN raw material powder used had a purity of 99%. A resistance heating element constituted by a coil spring composed of Mo was buried in the AlN molded body so as to be distributed throughout the AlN molded body. The resistance heating element was buried in such a manner that the resistance heating element started at a vicinity of the center of the AlN molded body, was arranged over the entirety of the AlN molded body in the manner of a single continuous line, and returned to the vicinity of the center. A positive terminal was attached to an end of the resistance heating element and a negative terminal was attached to the other end of the resistance heating element. The central portion of the AlN molded body was a circular region that had a diameter of 40% of the outer diameter of the AlN molded body. The peripheral portion was a ring-shaped region outside the central portion. The numbers of turns of winding per unit length of the coil spring in the central portion and the peripheral portion were: set so that the ratio of the density of heating was equal to the ratio of the density of heating specified in each Experimental example shown in Table1. Note that the ratio of the density of heating refers to a ratio of the amount of heat generated per unit area of the resistance heating element buried in the central portion to the amount of heat generated per unit area of the resistance heating element buried in the peripheral portion.

The resulting AlN molded body was placed in a mold of a firing furnace and fired by hot-pressing to form a ceramic base. The firing was performed at about 2000° C. Then, holes were formed in the backside of the ceramic base toward the terminals so that the terminals were exposed in the holes. A recess to which a thermocouple was t o be inserted was formed at the center of the backside of the ceramic base.

Meanwhile,a hollow shaft was prepared separately. AlN raw material powder similar to the raw material of the ceramic base was placed in a mold and molded by cold isostatic pressing (CIP) to form a thick-walled cylindrical molded body. The cylindrical molded body was fired in an atmospheric pressure furnace at about 2000° C. to obtain a cylindrical fired body. The outer surface of the cylindrical fired body was ground, and this the hollow shaft was obtained. Hollow shafts were fabricated so as to have the dimensions specified in each Experimental example shown in FIG. 4 and Table. 1.

Subsequently, the ceramic base and the hollow shaft were heated to about 2000° C. and joined with each other (solid phase bonding) while being arranged to be coaxial with each other and the backside of the ceramic base and the first flange of the hollow shaft brought into contact with each other. After joining, the surface of the ceramic was processed to have the dimensions shown in FIG. 4.

Feeding members were joined to the corresponding terminals of the resistance heating element by brazing. The feeding members were then connected to a power circuit. The thermocouple was inserted into and fixed to the recess formed at the center of the backside of the ceramic base. The lower end of the hollow shaft was attached to a cooling plate composed of metallic aluminum with an O-ring (allowable temperature limit: 200° C.) interposed therebetween. The feeding members and the thermocouple were installed to vertically penetrate through the cooling plate so as to keep the hermetically sealed state. The power circuit and the thermocouple were connected to the controller 50. The controller 50 controls the temperature of the ceramic base. Specifically, the controller receives the temperature measured by the thermocouple and controls power supply from the power circuit to the resistance heating element so that the measured temperature reaches the target temperature.

[Evaluation]

1. Temperature Distribution

A wafer for temperature measurement was prepared. The thermocouple were buried at a total of 17 points: at the center of the silicon wafer with a diameter of 300 mm, at 8 points along the circumference of a circle with a diameter of 140 mm (the points were evenly space along the circumference), and at 8 points along the circumference of a circle with a diameter of 280 mm (the points were evenly spaced along the circumference). The wafer for temperature measurement was placed on the wafer-receiving surface. The target temperature was set to 350° C., and the temperature of the ceramic base was controlled by the controller. Fifteen minutes after the start of the temperature control, the temperature at each point on the wafer for temperature measurement was read. The value obtained by subtracting the temperature at the center from the average of the temperatures at 8 points along the outermost circumference was assumed to be the center-cool temperature distribution. The center-cool temperature distribution of each Experimental example is shown in Table 1.

Temperature Control Property

Figure 5:
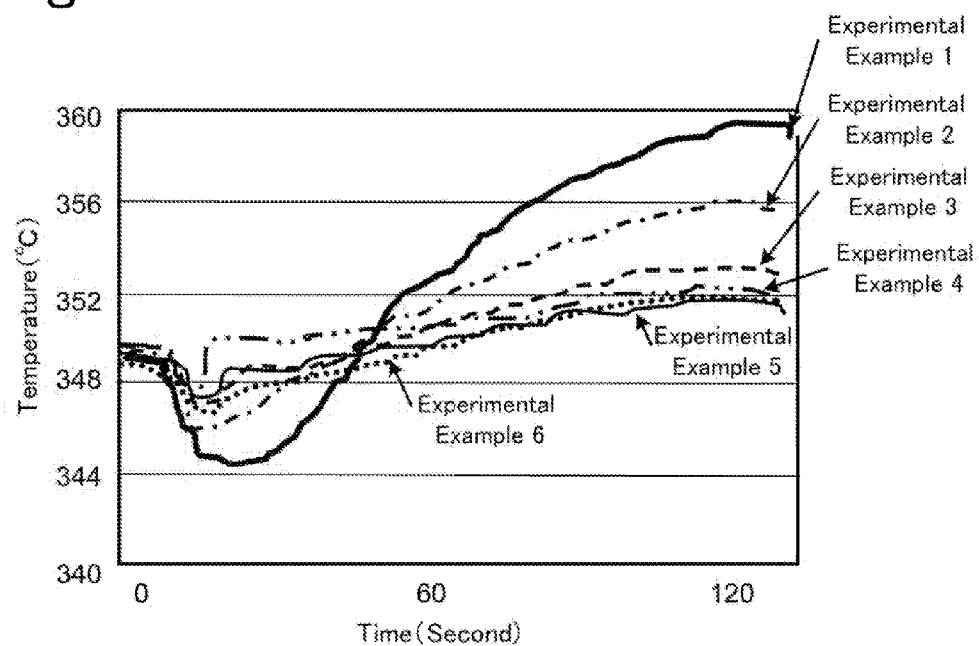
FIG. 5 is a graph showing temperature control properties of Experimental examples 1 to 6.
Figure 6:
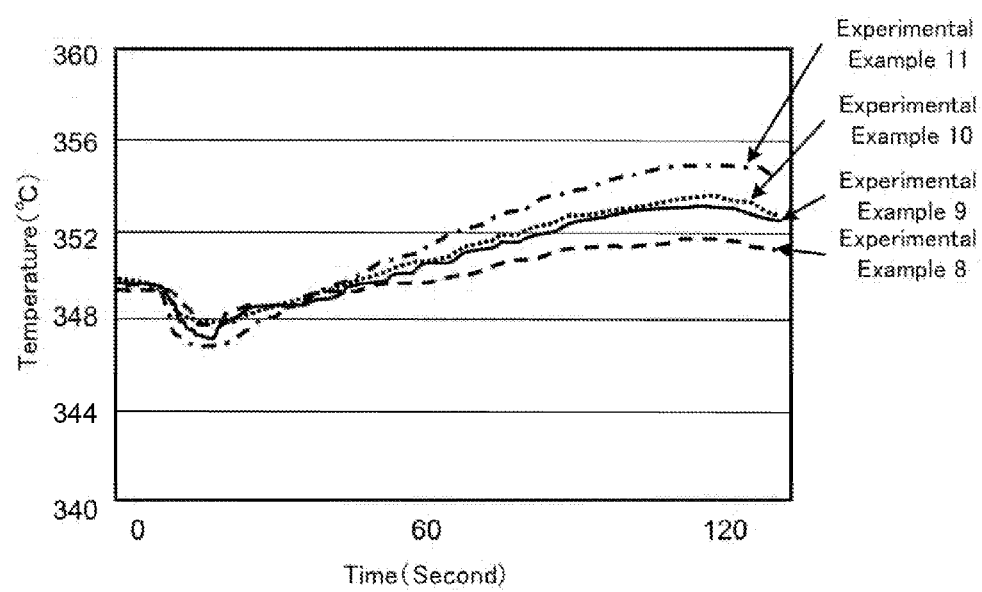
FIG. 6 is a graph showing temperature control properties of Experimental examples 8 to 11.

In was plasma CVD process, the target temperature was set 350° C. and temperature of the ceramic base was controlled by the controller. After the temperature measured by the thermocouple inserted at the center of the backside of the ceramic base reached about 350° C., a silicon wafer was placed on the wafer-receiving surface while continuing the temperature control of the ceramic base. Then, a semiconductor thin film was formed on the surface of the silicon wafer by plasma CVD. A graph showing the temperature control property was drawn by plotting the temperature measured by the thermocouple as ordinate and the elapsed time as abscissa. The time measurement was started when the silicon wafer was placed and the plasma CVD was started. The difference between the temperature measured at an elapsed time of 120 seconds and the target temperature was calculated, and the calculated difference was used as an index of the temperature control property. FIGS. 5 and 6 show graphs showing the temperature control property of each Experimental example. Table 1 shows the index of the temperature control property of each Experimental example. Referring to FIGS. 5 and 6, which show the temperature control property, in all Experimental examples, the measured temperature decreased for several seconds to several ten seconds immediately after placing the silicon wafer, that is, after starting the time measurement. In Experimental examples 3 to 6 and 8 to 10, the measured temperature became stable at substantially 350° C. after 120 seconds due to the temperature control by the controller. In contrast, in Experimental examples 1, 2, and 11, the measured temperature was 4.5° C. to 10° C. higher than 350° C. even after 120 seconds.

3. Shaft-End Temperature

In the temperature control property evaluation test described in paragraph 2 above, the temperature of the lower end of the hollow shaft (shaft-end temperature) at an elapsed time of 120 seconds was measured. The shaft-end temperature was measured by attaching the thermocouple to the inside periphery of the lowermost end of the hollow shaft. Table 1 shows the shaft-end temperature of each Experimental example.

words, the realization of the center-cool temperature distribution and the improvement of the temperature control property were both achieved. In addition, the temperature of the lower end of the hollow shaft was controlled so as to be lower than the allowable temperature limit of the O-ring. These effects resulted from the ratio of the density of heating being set to 1.4 to 2.0. the thickness tb1 of the first section being set to 6 to 10 mm, the thickness tb2 of the second section being set to 3 mm (tb2/tb1 being 0.3 to 0.5 and tb1/tb2 being 2 to 3.3), and the ratio of the length L1 of the first section relative to the overall length L of the hollow shaft (L1/L) being set to 0.4 to 0.8.

In contrast, in Experimental examples 1, 2, 6 to 8, and 11 (corresponding to Comparative Examples of the present invention), at least one of the following targets was not achieved: the realization of the center-cool temperature distribution, the improvement of the temperature control property, and the prevention of the temperature of the lower end of the hollow shaft from increasing excessively. In Experimental example 1, since the ratio of the density of heating was set to 0.6, the temperature control property was degraded. In Experimental example 2, since the ratio of the density of heating was set to 1.0, the center-cool temperature distribution was not realized. Experimental example 6 is the same as Experimental example 3 except that L1/L was set to 1.0. In Experimental example 6, although the realization of the center-cool temperature distribution and the improvement of the temperature control property were both achieved, the temperature of the lower end of the hollow shaft exceeded 200° C. In Experimental example 7, since the ratio of the density of

TABLE 1

| | Ratio of the Density of Heating[X1] | Thickness of a Hollow Shaft (mm) | | | Length of a Hollow Shaft (mm) | | | Center-cool Temperature Distribution (° C.)[X2] | Temperature Control Property[X3] | Shaft-end Temperature (° C.) | Comprehensive Evaluation |
|---|---|---|---|---|---|---|---|---|---|---|---|
| | | First Section tb1 | Second Section tb2 | tb2/tb1 (tb1/tb2) | First Section L1 | Overall Length L | L1/L | | | | |
| Experimental Example 1 | 0.6 | 3 | — | — | 170 | 170 | 1.0 | 3.0 | Unsuccess (10° C. Increase) | 138 | Unsuccess |
| Experimental Example 2 | 1.0 | 3 | — | — | 170 | 170 | 1.0 | −0.8 | Unsuccess (6° C. Increase) | 139 | Unsuccess |
| Experimental Example 3 | 1.4 | 6 | 3 | 0.5 (2.0) | 120 | 170 | 0.7 | 5.0 | Success (3° C. Increase) | 176 | Success |
| Experimental Example 4 | 1.7 | 7 | 3 | 0.4 (2.3) | 120 | 170 | 0.7 | 5.7 | Success (2° C. Increase) | 182 | Success |
| Experimental Example 5 | 2.0 | 10 | 3 | 0.3 (3.3) | 120 | 170 | 0.7 | 6.6 | Success (2° C. Increase) | 195 | Success |
| Experimental Example 6 | 1.4 | 6 | — | — | 170 | 170 | 1.0 | 6.1 | Success (2° C. Increase) | 208 | Unsuccess |
| Experimental Example 7 | 2.4 | 14 | 3 | 0.2 (5.0) | 120 | 170 | 0.7 | — | — | — | Unsuccess |
| Experimental Example 8 | 1.7 | 7 | — | — | 170 | 170 | 1.0 | 5.9 | Success (1.6° C. Increase) | 214 | Unsuccess |
| Experimental Example 9 | 1.7 | 7 | 3 | 0.4 (2.3) | 135 | 170 | 0.8 | 6.0 | Success (1.8° C. Increase) | 188 | Success |
| Experimental Example 10 | 1.7 | 7 | 3 | 0.4 (2.3) | 70 | 170 | 0.4 | 4.4 | Success (3° C. Increase) | 165 | Success |
| Experimental Example 11 | 2.0 | 10 | 3 | 0.3 (3.3) | 35 | 170 | 0.2 | 2.3 | Unsuccess (4.5° C. Increase) | 147 | Unsuccess |

[X1] A ratio of the density of heating in the central portion to the density of heating in the peripheral potion
[X2] The positive describes that the temperature is lower in the central portion than in the peripheral portion, and the negative describes that the temperature is higher in the central portion than in the peripheral portion.
[X3] The index of the temperature control property (the defference between the temperature measured at an elapsed time of 120 seconds and the target temperature) is described in parentheses.

[Results]

In Experimental examples 3 to 5, 9, and 10 (corresponding to Examples Of the present invention), the center-cool temperature distribution increased by 4° C. to 7° C., the index of the temperature control, property increased by 3° C. or less, and the shaft-end temperature was 200° C. or less. In other heating was set to 2.4 and tb2/tb1 was set to 0.2, fractures occurred during the fabrication. Experimental example 8 is the same as Experimental examples 9 and 10 except that L1/L was set to 1.0. In Experimental example 8, although the realization of the center-cool temperature distribution and the improvement of the temperature control property were both achieved, the temperature of the lower end of the hollow shaft exceeded 200° C. Experimental example 11 is the same as Experimental example 5 except that L1/L was set to 0.2. In Experimental example 11, the center-cool temperature distribution, was not sufficiently realized. In addition, the temperature control property was not improved.

The present application claims priority from Japanese Patent Application No. 2012-063054 filed on Mar. 21, 2012, the entire contents of which are incorporated herein by reference.

What is claimed is:

1. A heating device, including
a disk-shaped ceramic base that has a wafer-receiving surface,
a resistance heating element disposed inside the ceramic base, and
a hollow shaft attached to a surface of the ceramic base opposite to the wafer-receiving surface of the ceramic base,
wherein the ceramic base includes a central portion and a peripheral portion,
the peripheral portion is a ring-shaped region outside the central portion,
the resistance heating element is set so that the density of heating is higher in the central portion than in the peripheral portion,
the hollow shaft includes a first section that extends from the ceramic base to a predetermined intermediate position and a second section that extends from the intermediate position to a shaft end,
the thickness of the first section is 2 to 3.3 times the thickness of the second section, and
the length of the first section is 0.4 to 0.8 times the overall length of the shaft.

2. The heating device according to claim 1, including:
a thermocouple that measures the temperature of the central portion of the ceramic base in order to control the temperature of the ceramic base.

3. The heating device according to claim 1, wherein the resistance heating element is set so that the density of heating in the central portion is 1.4 to 2.0 times that in the peripheral portion.

4. The heating device according to claim 1, wherein the diameter of the first section is larger than the diameter of the second section.

5. The heating device according to claim 1, wherein the thickness of the first section is 6 to 10 mm.

6. A semiconductor manufacturing apparatus, including:
the heating device according to claim 1, and
a heat removal unit that removes heat from the hollow shaft at the intermediate position.

7. The semiconductor manufacturing apparatus according to claim 6, wherein the heat removal unit is configured to suction a gas around the intermediate position or is configured to inject a coolant as toward the intermediate position.

* * * * *

UNITED STATES PATENT AND TRADEMARK OFFICE
CERTIFICATE OF CORRECTION

PATENT NO. : 9,123,757 B2
APPLICATION NO. : 13/795552
DATED : September 1, 2015
INVENTOR(S) : Yutaka Unno and Junya Waki It is certified that error appears in the above-identified patent and that said Letters Patent is hereby corrected as shown below:

Title Page, Item (57), Abstract

Please change: "A heating device 10 includes a ceramic base 20, a resistance heating element 22, and a hollow shaft 40. The ceramic base 20 includes a central portion 20a and a peripheral portion 20b. The resistance heating element 22 is designed in such a manner that the density of heating in the central portion 20a is 1.4 to 2.0 times that in the peripheral portion 20b. The hollow shaft 40 includes a first section 41 and a second section 42. The thickness tb1 of the first section 41 is 6 to 10 mm. The thickness tb2 of the second section 42 is 0.3 to 0.5 times the thickness tb1 of the first section 41. The length of the first section 41 is 0.4 to 0/8 times the overall length of the hollow shaft 40." to -- A heating device 10 includes a ceramic base 20, a resistance heating element 22, and a hollow shaft 40. The ceramic base 20 includes a central portion 20a and a peripheral portion 20b. The resistance heating element 22 is designed in such a manner that the density of heating in the central portion 20a is 1.4 to 2.0 times that in the peripheral portion 20b. The hollow shaft 40 includes a first section 41 and a second section 42. The thickness tb1 of the first section 41 is 6 to 10 mm. The thickness tb2 of the second section 42 is 0.3 to 0.5 times the thickness tb1 of the first section 41. The length of the first section 41 is 0.4 to 0.8 times the overall length of the hollow shaft 40. --

Signed and Sealed this
Ninth Day of February, 2016

Michelle K. Lee
*Director of the United States Patent and Trademark Office*